(12) United States Patent
Madni

(10) Patent No.: US 6,304,142 B1
(45) Date of Patent: Oct. 16, 2001

(54) VARIABLE TRANSCONDUCTANCE AMPLIFIER

(75) Inventor: Arshad Madni, Swindon (GB)

(73) Assignee: Mitel Semiconductor Limited (GB)

( * ) Notice: Subject to any disclaimer, the term of this patent is extended or adjusted under 35 U.S.C. 154(b) by 0 days.

(21) Appl. No.: 09/590,330

(22) Filed: Jun. 8, 2000

(30) Foreign Application Priority Data

Jun. 10, 1999 (GB) .................................................. 9913423

(51) Int. Cl.[7] .................................................. H03F 3/45
(52) U.S. Cl. ........................................ 330/254; 330/260
(58) Field of Search ........................... 330/85, 254, 260; 327/359

(56) References Cited

U.S. PATENT DOCUMENTS

| | | | |
|---|---|---|---|
| 3,769,605 | * 10/1973 | Long | 330/260 X |
| 4,287,476 | * 9/1981 | Cense | 330/254 |
| 4,437,070 | * 3/1984 | Horl | 330/254 |
| 4,514,702 | * 4/1985 | Zogg | 330/254 |
| 5,528,197 | * 6/1996 | Frey | 330/254 |

* cited by examiner

Primary Examiner—Steven J. Mottola
(74) Attorney, Agent, or Firm—Kirschstein, et al.

(57) ABSTRACT

A variable transconductance amplifier comprises transistors and whose emitters are connected via resistors and to a constant current source to form a differential or long tail pair. A feedback amplifier whose transconductance is controllable has inputs connected to the collectors of the transistors and outputs connected to the emitters thereof. The feedback amplifier thus supplies a differential current to the emitters of the transistors which corresponds to the product of the differential output signal of the transistors and the variable transconductance of the feedback amplifier.

8 Claims, 4 Drawing Sheets

VARIABLE TRANSCONDUCTANCE AMPLIFIER

BACKGROUND OF THE INVENTION

1. Field of the Invention

The present invention relates to a variable transconductance amplifier. Such an amplifier may be used, for example, in radio frequency circuitry as part of an automatic gain control (AGC) circuit. For example, such an amplifier may be used within a mixer or front end low noise amplifier (LNA).

2. Description of the Prior Art

FIG. 1 illustrates a known type of voltage controlled variable gain amplifier comprising NPN bipolar transistors. The amplifier comprises a transconductance stage in the form of transistors T1 and 12, resistors R1 and R2 and a constant current source CC1, one of whose terminals is connected to ground gnd. The bases of the transistors T1 and T2 are connected to differential signal input terminals IN+ and IN−, respectively.

The collectors of the transistors T1 and T2 are connected to a current steering circuit comprising transistors 1 to 4. The emitters of the transistors 1 and 2 are connected to the collector of the transistor T1 whereas the emitters of the transistors 3 and 4 are connected to the collector of the transistor T2. The collectors of the transistors 2 and 4 are connected to a positive supply input or line vcc. The collectors of the transistors 1 and 3 are connected to differential output terminals OUT− and OUT+ and via load resistors 5 and 6, respectively, to the supply line vcc. The bases of the transistors 1 and 3 are connected to a first gain control input "agc adjust+" whereas the bases of the transistors 2 and 4 are connected to a second gain control input "agc adjust". In use, a differential gain control voltage is supplied to the gain control terminals so that, when maximum gain is required, all of the signal current from each of the transistors T1 and T2 is steered through the respective load resistor 5 and 6. Conversely, when minimum gain is required, the signal current is steered via the transistors 2 and 4 to the supply line vcc.

Although a voltage controlled variable gain amplifier of the type shown in FIG. 1 may be used in an AGC arrangement of a radio frequency (RF) tuner, it has certain disadvantages when used in such an application. For example, as the gain of the amplifier decreases, the noise figure (NF) increase. Also, using NPN technology (or NMOS technology for field effect transistors) increases the difficulty of connecting the outputs to, for example, a mixer of a frequency changer.

Further, in order to handle large amplitude input signals, the transconductance input stage requires sufficient power to maintain linearity. This may be achieved by providing the resistors R1 and R2 with relatively high values and using a low quiescent current, in which case the noise figure of the transconductance stage is compromised. Alternatively, higher quiescent current and lower values of the resistors R1 and R2 may be used but this results in increased power dissipation.

SUMMARY OF THE INVENTION

According to the invention, there is provided a variable transconductance amplifier comprising first and second amplifying devices whose common terminals are connected via first and second resistors, respectively, to a first current source, and a feedback amplifier of variable transconductance having outputs connected to the common terminals of the first and second devices for supplying a differential current corresponding to the product of a differential output signal of the first and second devices and the variable transconductance.

The first current source may comprise a first constant current source.

The first and second devices may be of a first conduction type and the feedback amplifier may comprise amplifying devices of a second conduction type opposite the first type.

The feedback amplifier may have an input stage comprising third and fourth devices whose control terminals are connected to output terminals of the first and second devices, respectively, and whose common terminals are connected via third and fourth resistors, respectively, to a second current source.

The second current source may comprise a second constant current source.

The output terminal of the third device may be connected to the common terminals of fifth and sixth devices whose output terminals are connected to the common terminal of the first device and a first power supply input, respectively, the output terminal of the fourth device may be connected to the common terminals of seventh and eighth devices whose output terminals are connected to the common terminal of the second device and the first power supply input, respectively, the control terminals of the sixth and eighth devices may be connected to a first gain control input and the control terminals of the fifth and seventh devices may be connected to a second gain control input.

The output terminals of the first and second devices may be connected via fifth and sixth resistors to the common terminals of ninth and tenth devices, respectively, whose, control terminals are arranged to receive a substantially constant bias voltage.

The output terminals of the first and second devices may be connected via seventh and eighth resistors to first and second signal inputs, respectively, of a mixer comprising: eleventh and twelfth devices, whose common terminals are connected to the first signal input, whose control terminals are connected to first and second local oscillator inputs and whose output terminals are connected to first and second outputs, respectively; and thirteenth and fourteenth devices whose common terminals are connected to the second signal input, whose control terminals are connected to the first and second local oscillator inputs and whose output terminals are connected to the first and second outputs, respectively.

Each of the devices may comprise a transistor. Each of the devices may comprise a bipolar transistor and the common, control and output terminals may comprise emitter, base and collector electrodes, respectively. Each of the first and second devices may comprise an NPN transistor.

The common, control and output terminals of an amplifying device refer to the normal use of such a device in an amplifying and inverting configuration. Thus, as mentioned hereinbefore, in the case of bipolar transistors the common, control and output terminals are the emitter, base and collector electrodes. In the case of field effect transistors, the common, control and output terminals are the source, gate and drain electrodes, respectively.

It is thus possible to provide a low noise variable transconductance amplifier whose pain may be varied without unacceptably comprising the noise figure. Also, the use of complementary technology means that large supply voltages are not required. This arrangement also facilitates the use of the amplifier as part of a mixer, such as a Gilbert mixer, which may use the amplifier as its input stage and at the same time provide automatic gain control.

BRIEF DESCRIPTION OF THE DRAWINGS

The invention will be further described, by way of example, with reference to the accompanying drawings, in which.

Like reference numerals refer to like parts throughout the drawings.

DESCRIPTION OF THE PREFERRED EMBODIMENTS

Figure 1:
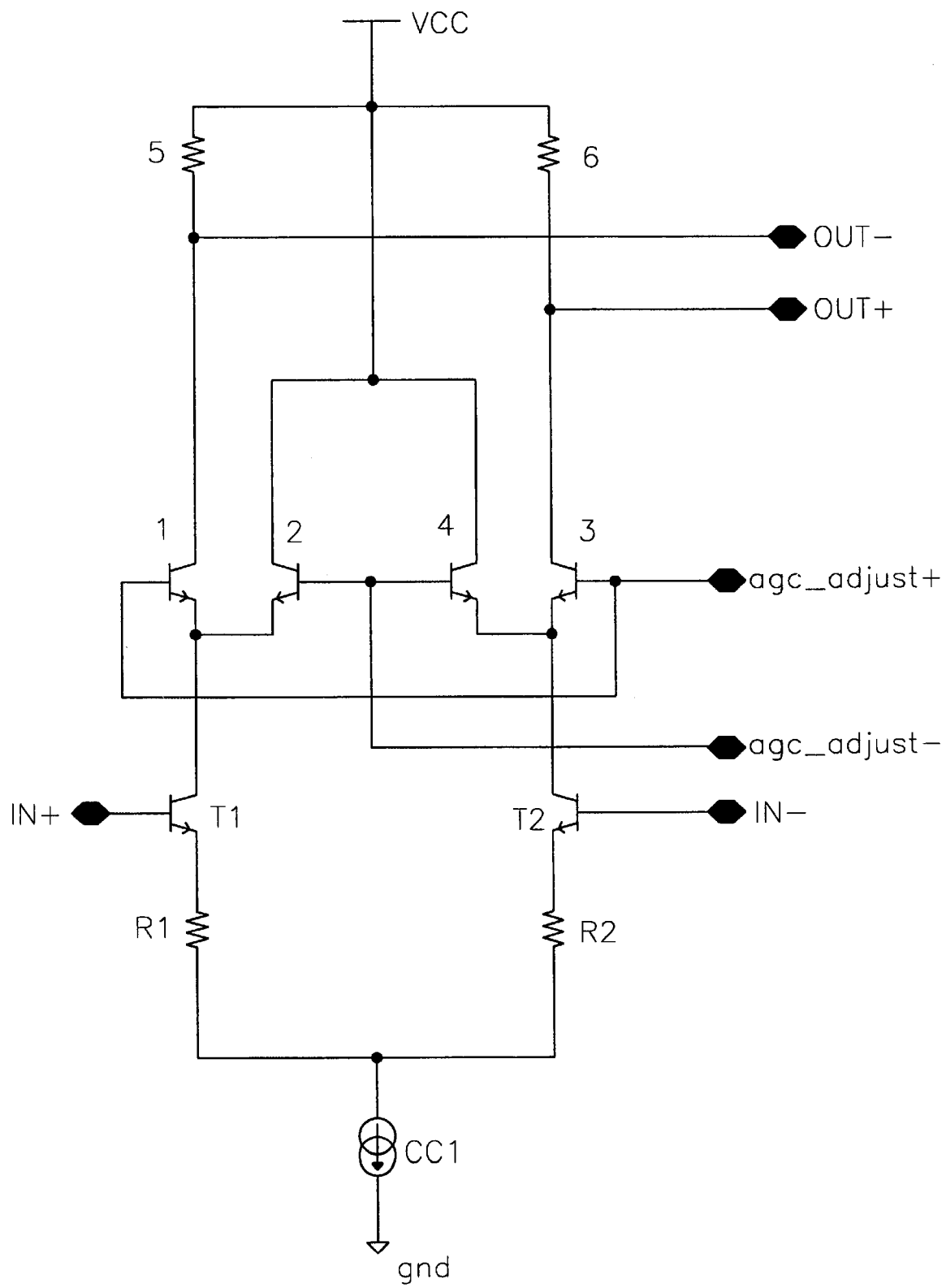
FIG. 1 is a circuit diagram of a known variable gain amplifier.
Figure 2:
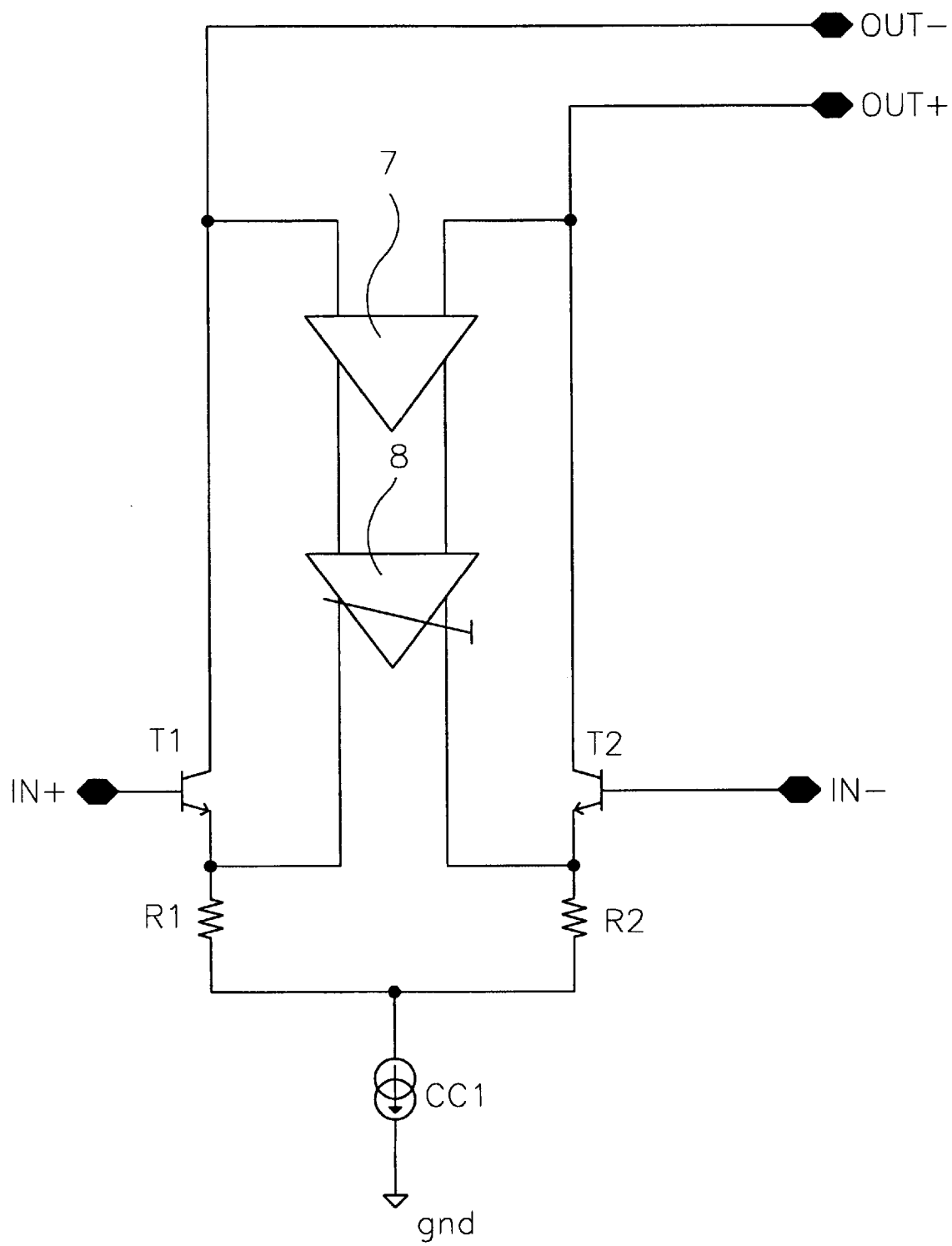
FIG. 2 is a schematic circuit diagram of a variable transconductance amplifier constituting an embodiment of the invention.

The variable transconductance amplifier illustrated in FIG. 2 comprises an input stage in the form of a differential or long tail pair. In particular, the input stage comprises NPN transistors T1 and T2 whose gates are connected to differential input terminals IN+ and IN−. The emitters of the transistors T1 and T2 are connected via resistors R1 and R2, respectively, to one terminal of a constant current source CC1 whose other terminal is connected to ground gnd. The collectors of the transistors T1 and T2 are connected to differential output terminals OUT− and OUT+. The collectors of the transistors T1 and T2 are also connected to a feedback amplifier having variable transconductance and comprising a transconductance stage 7 and a variable gain stage 8. The stage 8 has differential outputs which are connected to the emitters of the transistors T1 and T2.

In use, the stage 7 converts the differential output signal of the amplifier into a current which is varied by the stage 8 in accordance with the desired amplifier gain and fed back to the emitters of the transistors T1 and T2. In particular, by varying the gain of the stage 8, the transconductance of the "main" amplifier comprising the transistors T1 and T2 can be controlled. Such an arrangement may be used as part of an AGC circuit and provides variable gain without substantially comprising the noise figure. Further, it is not necessary to make any substantial compromise between noise figure and power dissipation of the amplifier.

Figure 3:
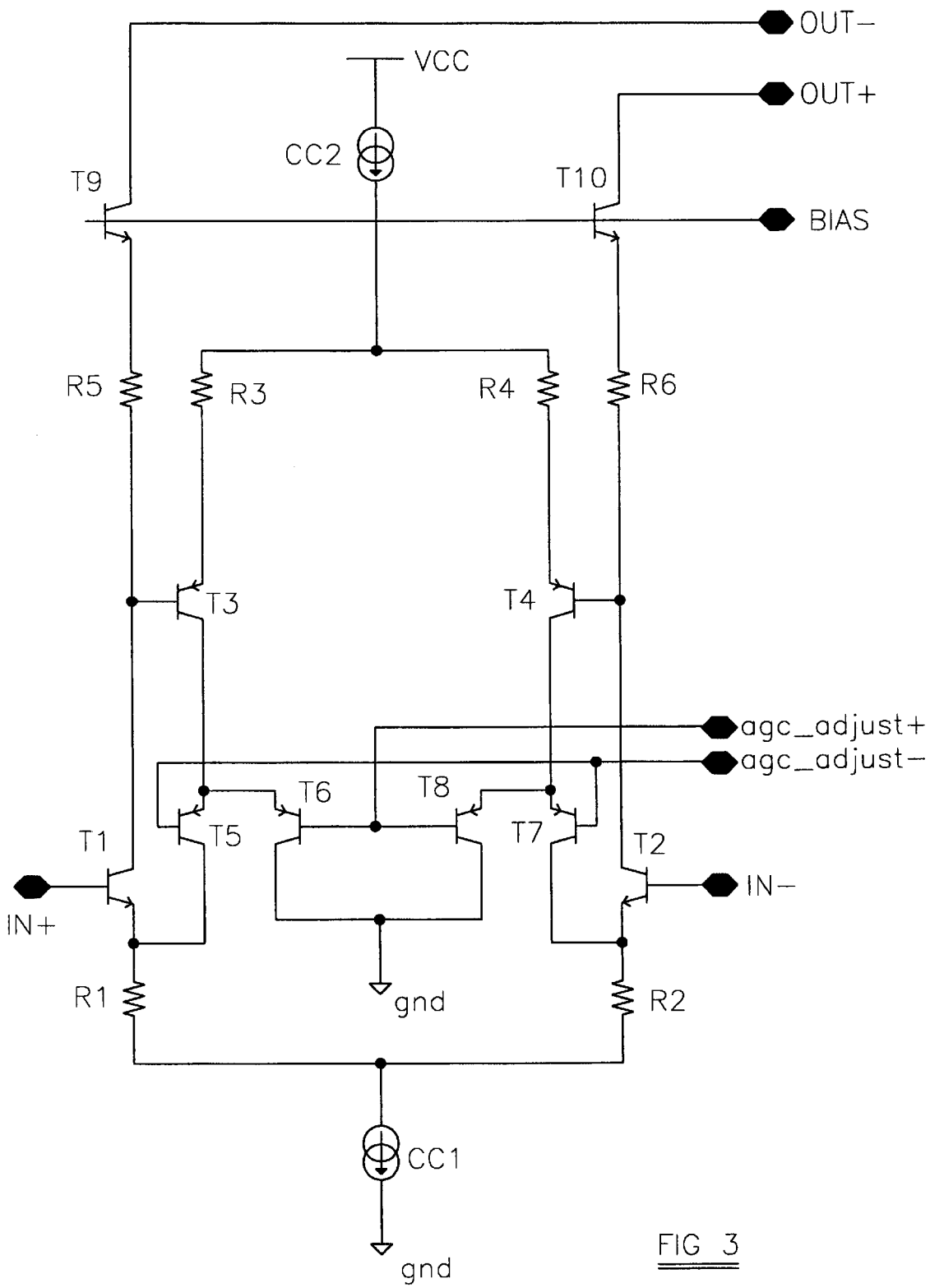
FIG. 3 is a circuit diagram of the amplifier of FIG. 2.

As shown in FIG. 3, the stages 7 and 8 are based on PNP transistors T3 to T8. The transistors T3 and T4 comprise another long tail pair whose bases are connected to the collectors of the transistors T1 and T2, respectively, and whose emitters are connected via resistors R3 and R4, respectively, to one terminal of another constant current source CC2, whose other terminal is connected to a positive supply input or line vcc. The collector of the transistor is connected to the emitters of transistors T5 and T6 whereas the collector of the transistor T4 is connected to the emitters of transistors T7 and T8. The collectors of the transistors T5 and T7 are connected to the emitters of transistors T1 and T2, respectively, whereas the collectors of the transistors T6 and T8 are connected to ground gnd. The bases of the transistors T6 and T8 are connected to a first gain control input "agc adjust+" whereas the bases of the transistors T5 and T7 are connected to a second gain control input "agc adjust−".

The amplifier shown in FIG. 3 is provided with a casecode output arrangement comprising NPN transistors T9 and T10. The emitters of the transistors T9 and T10 are connected to the collectors of the transistors T1 and T2 via resistors R5 and R6, respectively. The bases of the transistors T9 and T10 are connected to a bias input for receiving a substantially constant voltage bias (which input may be made available for providing adjustment of the bias voltage). The collectors of the transistors T9 and T10 are connected to "open-collector" differential outputs OUT− and OUT+.

In use, a differential input signal is supplied to the differential inputs IN+ and N−. A differential gain control voltage is supplied to the gain control inputs so as to control the gain of the amplifier The transistors T3 to T8 constitute a variable transconductance amplifier which feeds back to the emitter of the transistors T1 and T2 a current which is substantially proportional to the product of the amplifier differential output signal and the variable transconductance as determined by the control voltage. For maximum gain, the control voltage is such that little or no current flows through the transistors T5 and T7. In order to reduce the gain or transconductance of the amplifier, the control voltage is varied so as to increase the current through the transistors T5 and T7. This has the effect of "boosting" the values of the resistors R1 and R2 so as to increase the local feedback and hence reduce the transconductance of the transistors T1 and T2. However, this does not substantially affect the noise figure of the amplifier.

By fixing the ratio of the value of each of the resistors R1 and R2 to the internal emitter resistance of each of the transistors T1 and T2, the distortion performance of the amplifier is substantially fixed under maximum gain conditions. However, at minimum gain, the distortion is reduced because the value of each of the resistors R1 and R2 is actively boosted while maintaining the internal emitter resistance of the transistors T1 and T2 substantially constant. In order to achieve this, the output current of the constant current source CC2 must be smaller than that of the constant current source CC1.

The use of complementary transistor technology means that large supply voltages are not required.

Although the amplifier is shown as being embodied by bipolar transistors, such an amplifier may be embodied using other active amplifying devices, such as field effect transistors of junction or insulated gate type.

Figure 4:
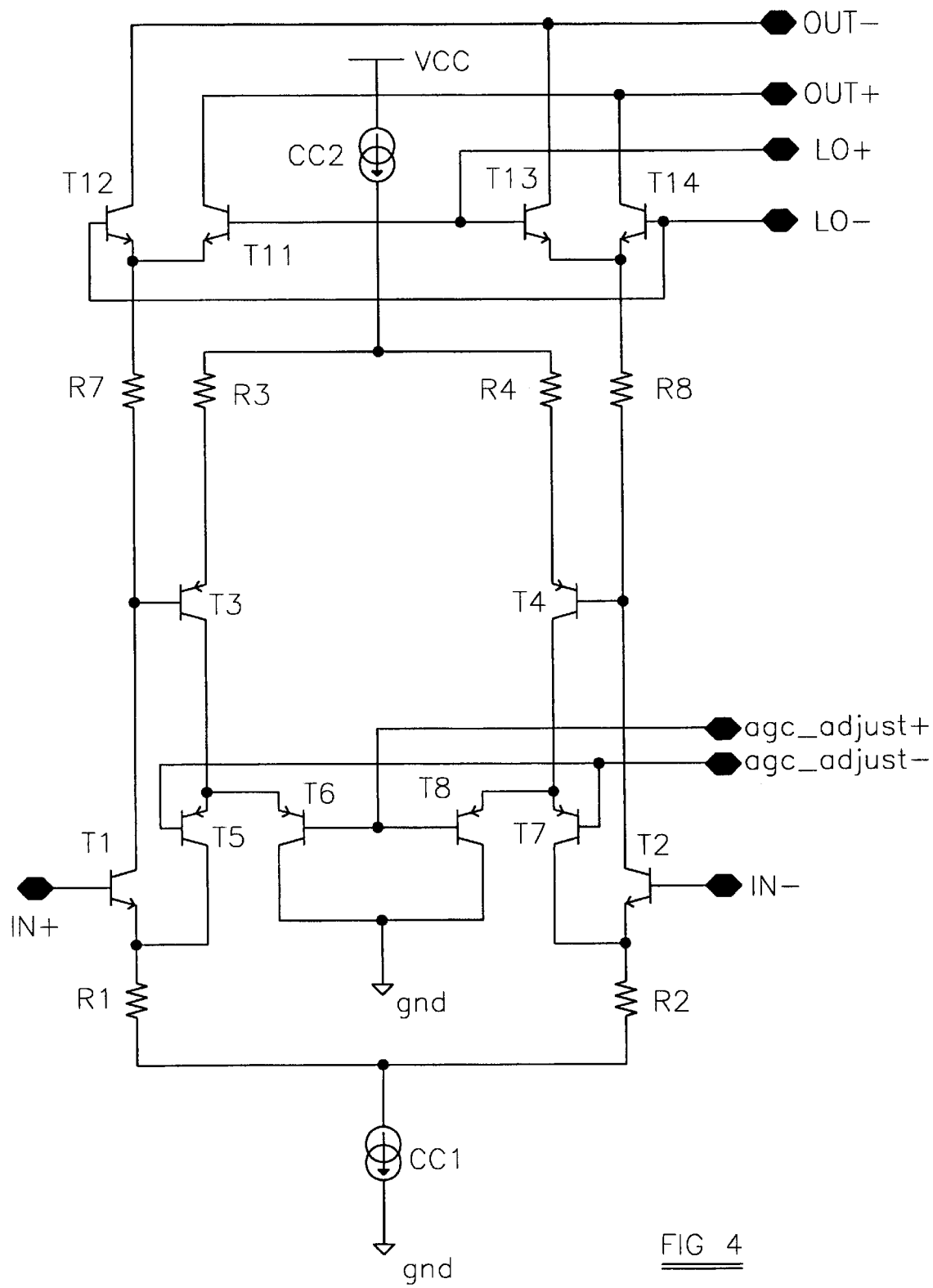
FIG. 4 is a circuit diagram of an amplifier of the type shown in FIG. 2 as an input stage of a mixer.

The variable transconductance amplifier may be used as part of a mixer and FIG. 4 illustrates such an arrangement with a Gilbert mixer "stacked" on the amplifier. The amplifier differs from that shown in FIG. 3 in that the resistors R5 and R6 and the transistors T9 and T10 are omitted and replaced by resistors R7 and R8 and NPN transistors T11 to 14. The emitters of the transistors T11 and T12 are connected via the resistor R7 to the collector of the transistor T1 whereas the emitters of the transistors T13 and T14 are connected via the resistor 8 to the collector of the transistor T2. The collectors of the transistors T11 and T14 are connected to a first differential output OUT+ whereas the collectors of the transistors T12 and T13 are connected to a second differential output OUT−. The bases of the transistors T11 and T13 are connected to a first differential local oscillator input LO+ whereas the bases of the transistors T12 and T14 are connected to a second differential local oscillator input LO−.

The gain control voltage for the gain control inputs is supplied from a suitable circuit of a tuner in any suitable (e.g. known) way so as to vary the gain of the variable transconductance amplifier. Automatic gain control and frequency changing can therefore be performed in a single circuit arrangement or stage. The AGC function is provided with a lower noise figure than for known arrangements.

What is claimed is:

1. A variable transconductance amplifier comprising: first and second resistors; a first current source; first and second amplifying devices, each of which has a common terminal, a control terminal and an output terminal, said common terminals of said first and second devices being connected via said first and second resistors, respectively, to said first current source; and a feedback amplifier having a variable transconductance and having outputs connected to said common terminals of said first and second devices for supplying a differential current corresponding to a product of a differential output signal of said first and second devices and said variable transconductance.

2. An amplifier as claimed in claim 1, in which said first current source comprises a first constant current source.

3. An amplifier as claimed in claim 1, in which said first and second devices are of a first conduction type and said feedback amplifier comprises amplifying devices of a second conduction type opposite said first type.

4. An amplifier as claimed in claim 3, in which said feedback amplifier has an input stage comprising: third and fourth resistors; a second current source; and third and fourth devices, each of which has a common terminal, a control terminal, and an output terminal, said control terminals of said third and fourth devices being connected to said output terminals of said first and second devices, respectively, and said common terminals of said third and fourth devices being connected via said third and fourth resistors, respectively, to said second current source.

5. An amplifier as claimed in claim 4, in which said second current source comprises a second constant current source.

6. An amplifier as claimed in claim 3, in which said feedback amplifier comprises first and second gain control inputs and fifth to eighth devices, each of which has a common terminal, a control terminal and an output terminal, said output terminal of said third device being connected to said common terminals of said fifth and sixth devices, said output terminals of said fifth and sixth devices being connected to said common terminal of said first device and a first power supply input, respectively, said output terminal of said fourth device being connected to said common terminals of said seventh and eighth devices, said output terminals of said seventh and eighth devices being connected to said common terminal of said second device and said first power supply input, respectively, said control terminals of said sixth and eighth devices being connected to said first gain control input and said control terminals of said fifth and seventh devices being connected to said second gain control input.

7. An amplifier as claimed in claim 1, comprising fifth and sixth resistor sand ninth and tenth devices, each of which has a common terminal, a control terminal and an output terminal, said output terminals of said first and second devices being connected via said fifth and sixth resistors to said common terminals of said ninth and tenth devices, respectively, said control terminals of said ninth and tenth devices receiving a substantially constant bias voltage.

8. An amplifier as claimed in claim 1, comprising seventh and eighth resistors and a mixer having first and second signal inputs, first and second local oscillator inputs and eleventh to fourteenth devices, each of which has a common terminal, a control terminal and an output terminal, said output terminals of said first and second devices being connected via said seventh and eighth resistors to said first and second signal inputs, respectively, said common terminal of said eleventh and twelfth devices being connected to said first signal input, said control terminals of said eleventh and twelfth devices being connected to said first and second local oscillator inputs, said output terminals of said eleventh and twelfth devices being connected to said first and second outputs, respectively, said output terminals of said thirteenth and fourteenth devices being connected to said second signal input, said control terminals of said thirteenth and fourteenth devices being connected to said first and second local oscillator inputs and said output terminals of said thirteenth and fourteenth devices being connected to said first and second outputs, respectively.

* * * * *